US006984533B1

(12) United States Patent  
Regos et al.

(10) Patent No.: US 6,984,533 B1  
(45) Date of Patent: Jan. 10, 2006

(54) METHOD OF SORTING DICE BY SPEED DURING DIE BOND ASSEMBLY AND PACKAGING TO CUSTOMER ORDER

(75) Inventors: Ramon R. Regos, San Ramon, CA (US); Alelie T. Funcell, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 734 days.

(21) Appl. No.: 09/974,552

(22) Filed: Oct. 9, 2001

(51) Int. Cl.  
*H01L 21/66* (2006.01)

(52) U.S. Cl. ............................................ 438/15; 438/17

(58) Field of Classification Search ............... 438/5–7, 438/10–11, 14–18, 25–26, 64, 106–107  
See application file for complete search history.

(56) References Cited

U.S. PATENT DOCUMENTS 5,927,512 A * 7/1999 Beffa .......................... 209/573  
5,998,228 A * 12/1999 Eldridge et al. ............... 438/15  
6,219,908 B1 * 4/2001 Farnworth et al. ............ 29/833  
6,472,239 B2 * 10/2002 Hembree et al. .............. 438/18  
6,764,869 B2 * 7/2004 Eldridge ....................... 438/15

* cited by examiner

*Primary Examiner*—Michael Lebentritt  
*Assistant Examiner*—Andre C. Stevenson  
(74) *Attorney, Agent, or Firm*—Edel M. Young; Justin Liu

(57) ABSTRACT

When integrated circuit dice are tested as part of a completely manufactured wafer, the individual die is tested both for proper function and for speed grade. A wafer map is formed in a computer to keep up with which dice on the wafer are good and to record the speed grade of each good die. This wafer map is then used during the step of dicing and packaging the wafer to fill existing orders by placing a die that meets a speed grade of an order into the package that has been ordered. More than one kind of order can be filled from dice in a single wafer. The method allows integrated circuit devices to be packaged to order and eliminates the need to keep an inventory of packaged dice.

7 Claims, 3 Drawing Sheets

**Computer Memory of Diced
Graded Inventory**

Wafer   Loc   Speed

| Wafer | Loc | Speed |
|-------|------|-------|
| 36541 | 31x12 | 5 |
| 36541 | 31x16 | 6 |
| 36541 | 31x17 | 5 |
| 36541 | 31x18 | 6 |
| 36541 | 31x19 | 6 |
| 36541 | 31x20 | 7 |
| 36541 | 31x26 | 6 |
| 36541 | 32x06 | 6 |
| 36541 | 32x08 | 5 |
| 36541 | 32x09 | 5 |
| 36541 | 32x11 | 4 |
| 36541 | 32x13 | 4 |
| 36541 | 32x14 | 5 |
| 36541 | 32x16 | 6 |
| 36541 | 33x06 | 6 |
| 36541 | 33x10 | 6 |
| 36541 | 33x16 | 6 |
| 36541 | 33x26 | 6 |
| 36541 | 34x26 | 5 |
| 36542 | 11x06 | 6 |
| 36542 | 11x07 | 6 |
| 36542 | 11x09 | 7 |
| 36542 | 11x16 | 6 |
| 36542 | 11x17 | 6 |
| 36542 | 11x18 | 7 |
| 36542 | 11x19 | 8 |
| 36542 | 12x01 | 8 |
| 36542 | 12x02 | 8 |
| 36542 | 12x04 | 7 |
| 36542 | 12x06 | 6 |

Fig. 4

**Computer Memory of Orders
Not Yet Filled**

| Qty | Part | Speed | Package |
|-----|------|-------|---------|
| 15 | XCV1000 | 6 | PQ240 |
| 40 | XCV1000 | 7 | FG256 |
| 25 | XCV1000 | 5 | BG352 |

Fig. 5

METHOD OF SORTING DICE BY SPEED DURING DIE BOND ASSEMBLY AND PACKAGING TO CUSTOMER ORDER

FIELD OF THE INVENTION

The present invention relates to testing of integrated circuit devices, packaging them, and supplying them in response to a customer order.

BACKGROUND

In the manufacturing and selling of integrated circuit devices, it is common to test integrated circuit dice while still part of a semiconductor wafer and mark or map the dice that perform properly, then dice the wafer into chips and discard the unacceptable dice.

Most integrated circuit devices are advertised as operating at a given speed. These devices are available in only one speed grade (unless older devices at a lower speed grade are still available). During manufacturing, if an acceptable speed is not achieved, the die is marked as bad and discarded.

However, some products, such as FPGAs, are offered in multiple speed grades, and the higher speed grades are sold at higher prices. It is desirable from the point of view of such a manufacturer to sell each device at the highest possible price while meeting the advertised speed grade.

Customers who buy integrated circuit devices available at several speed grades typically want them in a particular kind of package and want them to operate at a selected speed. In the past, when a customer orders parts and specifies the package and speed grade, the dice that have been tested and found good are packaged into the desired package, then tested for speed. Typically, some of the dice will prove to be faster than ordered, some will be the speed ordered, and some will be too slow to be acceptable. Those that are too slow will not be sold to the customer. Sometimes if insufficient inventory is available at the speed grade ordered, the manufacturer may fill an order using devices having a higher speed grade than ordered, but at the lower price.

FIG. 1 shows a conventional process for testing, packaging, and shipping integrated circuit devices. Starting from the completely manufactured integrated circuit wafer, during wafer sort process 100, at step 101 the wafer is tested to identify good and bad dice. At step 102, while the dice on the wafer are being tested, a map is made of which dice meet each speed grade. At step 103, bad dice may be inked, or otherwise designated for later discarding.

At step 104 the wafer is sawed or diced to separate the dice from each other.

During the die attach and bonding process 105, at step 106, the good dice are picked and each is attached to a pre-selected package type. However, in the past, the speed grade of each die is not retained. At step 107, bad dice are discarded.

At step 108, the good dice are wire bonded to pins in the package. At step 109, the die with its wire bonds is encapsulated to complete the package, and at step 110, the package receives initial marking, such as the name of the company, the part number, the package type, and other available information. It may also be marked with a particular speed grade, especially if the wafer was found to include predominantly one speed grade. However, with some equipment, information about the speed grade of the particular die has been lost during this handling process.

At step 111, an electrical test for proper functioning also includes a test for speed grade.

At step 112, if the die is still good after packaging, it may be marked with the speed grade if speed grade was not marked earlier. If there is an outstanding order for this package with this speed grade, at step 113, devices meeting these requirements are shipped to the customer. If there is insufficient inventory to meet the order, devices having a higher speed grade may be re-marked to the lower speed grade and also shipped to complete the order. At step 114, devices having other speed grades or devices not yet ordered are stored as finished goods in speed bins according to their speed grades.

Thus, the past method results in two inefficiencies: dice that are faster than ordered do not always sell at their highest price, plus they incur a re-marking expense, and dice that are slower than ordered are often packaged and stored as inventory for an extended period, and may even be discarded.

It is desirable to develop a test method and equipment that will improve efficiency over the present test methods and equipment.

SUMMARY OF THE INVENTION

The present invention makes full use of the wafer map made while the dice are still part of a wafer. After the wafer is diced, the speed grade information is used to pick and place dice of several speed grades into different packages according to what speed grades are present in the wafer and what packages and speed grades have been ordered.

According to one aspect of the invention, a circuit is configured or included in the die for cycling an oscillating signal through portions of the die and determining the oscillation speed, then relating this speed to the speed grade of the packaged die. When the dice on a wafer are tested for proper operation and at least the good ones are also tested for speed, a map is made of speed grades of dice in the wafer. This information is passed to a die attach machine so that dice of different speed grades can be packaged in different packages to complete orders for those speed grades and packages. The die attach machine can be programmed to die bond chips of different speed grades to different package types, and for the different package types or different speed grades to be placed into separate waffle packs or die carriers to enable die storage for future sale or future assembly.

Advantages of the structure and method are that packaged goods inventory can be greatly reduced or eliminated. Inventory is stored as unpackaged dice, giving flexibility for later choosing the package type when the goods are ordered. The dice can then be efficiently packaged to order. Also package marking of the speed grade can be done before final electrical test, which is an improvement in the packaging flow, and eliminates the need for re-marking packages for speed down-grade. The step of packaging to order can take a relatively short amount of time, and typically does not inconvenience the customer. Yet the manufacturer need not keep an inventory of finished goods on the shelf hoping that a customer will buy just the package and speed grade that is in the inventory.

The process of the invention greatly simplifies inventory in an industry which offers many different package types. Finished wafers are stored whole, or diced chips are stored unpackaged but identified. Sometimes a particular kind of device may be offered in as many as 20 packages. Storage of finished goods in 20 different kinds of packages is highly burdensome. The present invention can be used to completely eliminate the inventory of packaged goods (step 114 in FIG. 1) if all packaging is done to order. Thus the invention reduces the cost of manufacturing.

BRIEF DESCRIPTION OF THE DRAWINGS

FIG. 4 shows a record format according to one aspect of the invention for storing information on dice that have been tested.

FIG. 5 shows a record of orders not yet filled.

DETAILED DESCRIPTION

Figures 2, 3:
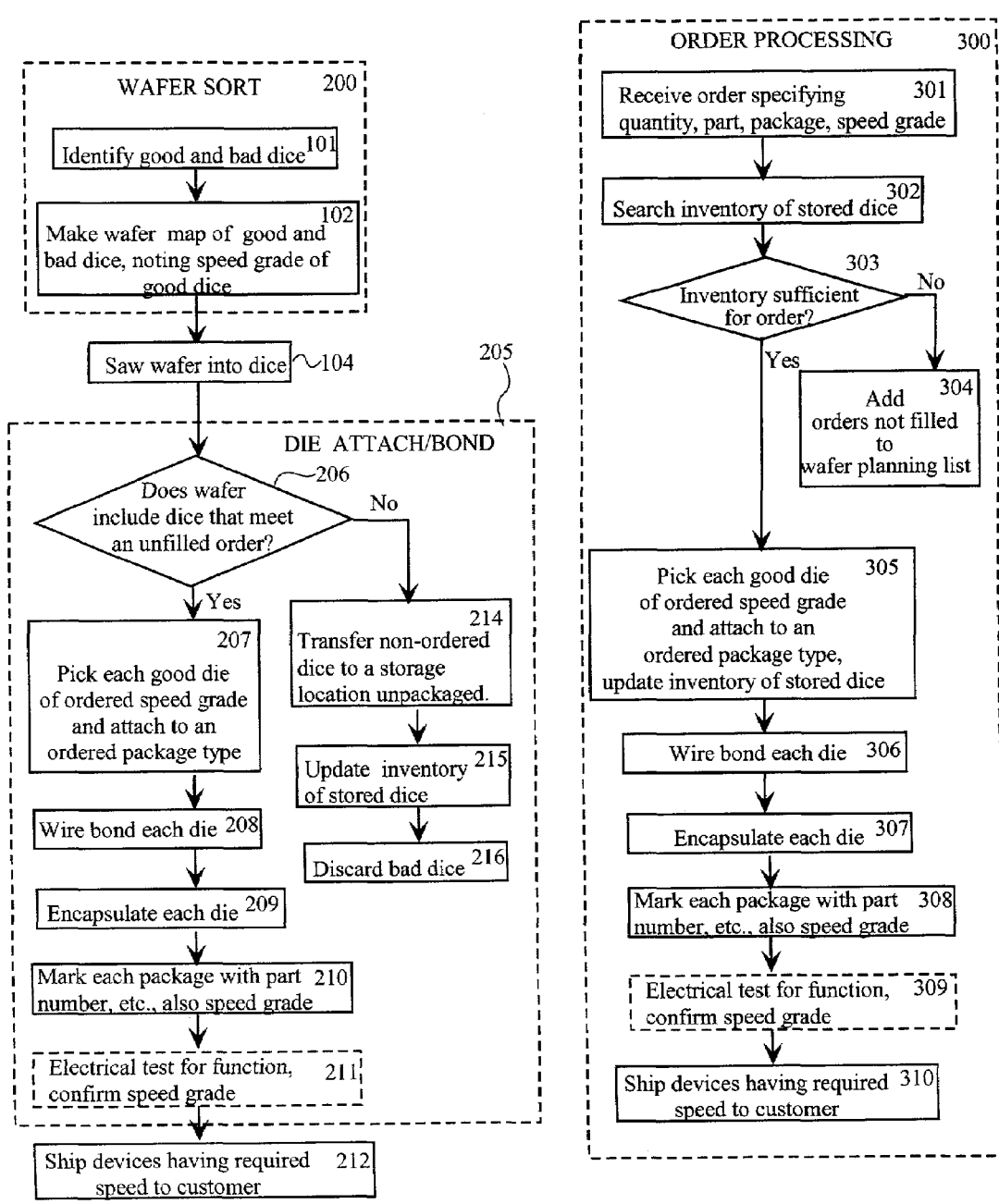
FIG. 2 shows the inventive process in which a die attach machine picks dice from a wafer according to a wafer map and places them in several locations according to existing orders.
FIG. 3 shows a method according to the present invention of order processing that packages stored dice according to existing orders and updates plans for future wafers.

FIG. 2 shows a method according to the invention for processing a die from the completed wafer stage to being shipped to a customer.

Wafer Sort process 200 begins as in the prior art with step 101 of identifying good and bad dice (chips). Next, at step 102, not only is a record made of how many good dice meet each speed grade, but a map of the wafer is made that indicates the speed grade of each good die on the wafer. This map is stored in a computer and is used later for processing after the wafer has been diced. As in the prior art, at step 104, the wafer is diced.

Then, according to the invention, die attach/bonding process 205 makes use of this wafer map. The die attach process takes into account what device types and packages have actually been ordered and participates in the process of filling the orders. At step 206, software associated with the die attach and bonding step determines whether the wafer includes dice that can fill outstanding orders. If so, at step 207, a programmed die attach machine responds to the customer order, sometimes several customer orders in parallel. For an order of devices at a first speed grade using a first package, the die attach machine picks dice of this first speed grade and places them into the first type of package until that order has been completed or until all dice of that first speed grade that are on the wafer have been placed into their packages. Then if there is a second order, the die attach machine places dice of a second speed grade into a second desired package until the order has been filled or until all dice of the second speed grade are placed. The die attach machine may complete more than one order of the same speed grade and same package type if such a combination of orders exists. This process may continue for third, fourth, etc. speed grades and package types until all ordered dice on the wafer have been matched with the order. Several orders of processing are contemplated with the invention. The die attach machine may proceed to fill a single order, completing as much of that order as possible before proceeding to another order. If the die attach equipment can handle several wafers simultaneously, a single order can be filled by picking from several wafers. As a further alternative, if many package types can be processed simultaneously, the die attach machine may proceed, using the wafer map as a guide, to fill as many orders as can be filled from a wafer.

At steps 208 and 209, as in the prior art process, each package-attached die is wire bonded to pins in the package and encapsulated.

Next, at step 210, the packaged dice are marked with relevant information including their speed grade, and in some cases, at step 211, a final electrical test is performed. At step 212, the packaged dice are shipped to the customer. If a customer's order is still incomplete after processing of a wafer or several available wafers, a particular shipment may be held until the next wafer is processed, or the order may be shipped in two batches.

While the processing of a single die occurs in the serial order shown, the equipment for carrying out the process is typically arranged in an assembly line, where as soon as a die has been attached to a package in step 207, the die attach machine will update the wafer map and again at step 206 question the order and the wafer map to determine whether the wafer still includes dice that meet an unfilled order. If there are more dice ordered, the die attach machine will pick the next die and attach it to a package.

Meanwhile, a die that has been attached to a package in step 207 will move to a wire bonding station where it will be bonded in step 208, encapsulated into a package at step 209, marked at step 210, possibly electrically tested at step 211, and shipped at step 212. Steps 208–212 are known steps when taken alone, and the novelty lies in the combination, particularly in being able to mark the packages at step 210 with a known speed grade and not having to re-mark later.

A preferred die attach machine will have the ability to place dice both into packages for shipment and into carriers or waffle packs for storage. If step 206 determines that good dice remaining in the diced wafer have not been ordered, at step 214, these good dice are transferred to a storage location such as a chip carrier where they are stored according to speed grade and at step 215 inventoried for later sale. Since these dice are not yet packaged, the stored inventory is more general purpose, since an un-packaged die can be placed into more than one package, as desired by a customer. At step 216, the bad dice are discarded.

Figure 1:
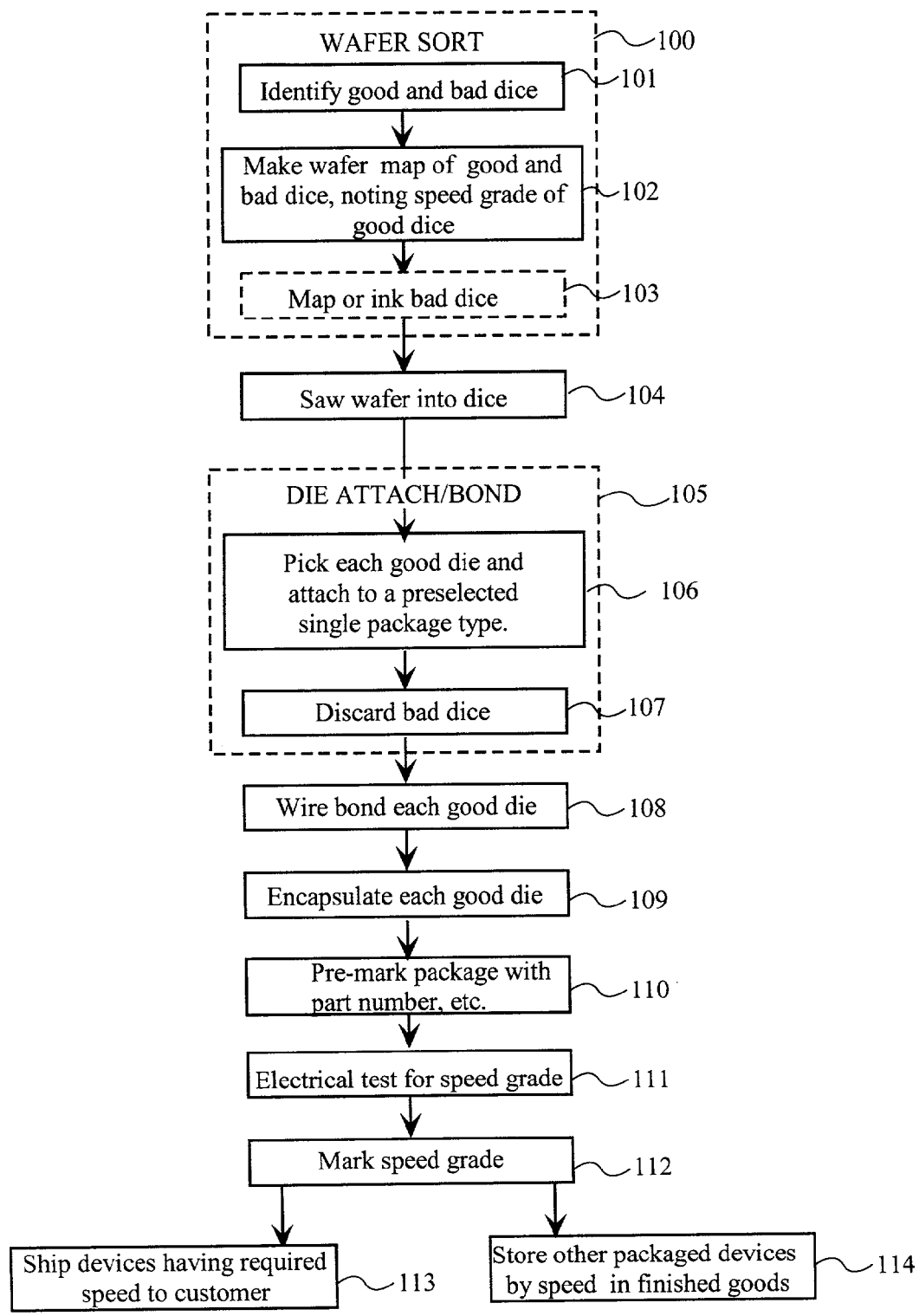
FIG. 1 shows a prior art method of testing, sorting, packaging, and marking integrated circuit devices having multiple speed grades.

In the prior art process of FIG. 1, there may have been a temptation not to package some of the dice, especially if only one or two dice of a given speed grade remain, and the process would require additional handling for these odd devices. However, in the process of the present invention, placing the unused dice in a storage location specific to the speed grade is easy to do, and keeping up with the inventory is also easy to do.

FIG. 3 shows steps for processing orders from an existing inventory of stored dice. A computer, for example, the same computer that keeps up with the wafer map, keeps up with remaining dice that have not yet been sold. When further orders are received at step 301, chip carriers or other storage devices are then available and can be moved into position so that dice can be picked from these carriers. At step 302, the computer searches its inventory of dice not sold for dice that satisfy the order. At step 303, the computer determines whether there is sufficient inventory to process the order. At step 304 the computer records any orders or parts of orders that can not be filled and this record is added to a wafer planning list. In one embodiment, the computer also manages wafer sorting in progress, as described in connection with FIG. 2, and if wafers in progress can help fill the order, the computer puts this information into the data base that controls the wafer sort and die attach process of FIG. 2. Thus, a single order may be filled partly from stored inventory and partly from wafers in process.

For filling a particular order, the computer must often choose between dice that have been stored and dice that are part of a wafer sorting process. In one embodiment, the computer gives preference to stored dice, thus rotating inventory on a somewhat first-in-first-out basis. In another embodiment, in order to reduce handling by eliminating the steps of moving dice to and from their storage locations, the computer gives preference to dice that are in the wafer sorting process.

Steps 305–310 are similar to steps 207–212. The difference is that at step 305, dice are picked from a storage device instead of from a wafer. Step 305 typically includes moving a storage container into position so that dice can be picked from the storage container. As discussed above, the steps typically occur in assembly line fashion with any particular die experiencing the processing steps serially as shown, but with several sequential processing steps being performed simultaneously. The inventory may be updated by an inventory control system operating in parallel with the computer that controls the die attach machine, or this computer may continuously update the inventory as the dice are picked.

The process of the invention greatly simplifies inventory in an industry which offers many different package types. Finished wafers are stored whole, or diced chips are stored unpackaged but identified. Sometimes a particular kind of device may be offered in as many as 20 packages. Storage of finished goods in 20 different kinds of packages is highly burdensome. The present invention can be used to completely eliminate the inventory of packaged goods (step 114 in FIG. 1) if all packaging is done to order. Thus the invention reduces the cost of manufacturing.

FIGS. 4 and 5 show records stored in the computer. FIG. 4 shows the record of wafers that have been tested and diced having chips not yet packaged or sold. The computer keeps up with the wafer number and stores information about good dice on the wafer, in particular their locations and speed grades. All dice on a wafer are the same type or part number, and another record not shown indicates the part number of each wafer. For a given wafer, for example wafer 36541 in FIG. 4, the location of each good die is stored along with its speed grade. In FIG. 4, for example the first line shows that there is a good die at location 31×12 (column 31 row 12) and that this die meets speed grade 5. Also shown in FIG. 4 is a record for wafer 36542 showing that 11 good dice remain and that they have speed grades from 6 to 8.

FIG. 5 shows three orders that have been placed for parts of type XCV1000. A customer has ordered 15 parts of speed grade 6 in package PQ240. The computer recognizes that this order can be filled from the two wafers illustrated in FIG. 3 because 15 of the dice on those two wafers are of speed grade 6. Thus those 15 dice will be packaged into PQ240 packages and shipped to the customer. If the customer had ordered a few more parts, some of the parts at speed grade 7 or 8 could have also been packaged and shipped to fill the order. Typically there will be more partly used wafers to choose from, not shown here, and it is preferable to fill an order of speed grade 6 with parts meeting speed grade 6 so that the faster parts can be saved for orders of faster parts.

From the above description, one of ordinary skill in the art can derive variations, and these variations are intended to fall within the scope of the present invention, which is defined by the claims.

What is claimed is:

1. A method of sorting dice by speed comprising:
   identifying good and bad dice while the dice are part of a wafer;
   making a wafer map of speed grades of the good dice;
   dicing the wafer;
   for a wafer having first and second speed grades different from each other:
      filling an order for a first package type and the first speed grade by attaching dice of the first speed grade to packages of the first package type; and
   placing dice of the second speed grade into another location; and
   completing the process of packaging.

2. The method of sorting dice of claim 1 wherein the step of placing dice of the second speed grade into another location comprises:
   filling an order for a second package type and the second speed grade by attaching dice of the second speed grade to packages of the second package type.

3. The method of sorting dice of claim 1 wherein the step of placing dice of the second speed grade into another location comprises:
   placing dice of the second speed grade into a carrier for storage until the second speed grade is ordered.

4. The method of claim 1 comprising the further step of:
   marking each of the packages with a mark indicating the first speed grade.

5. The method of claim 1 wherein the steps of attaching dice are performed by a programmed die attach machine that uses the speed grades in the wafer map.

6. The method of claim 5 wherein the die attach machine further transfers some of the dice to a storage location unpackaged.

7. The method of claim 5 wherein the die attach machine fills part of an order by attaching dice that have been stored in a storage location to packages of the first package type.

\* \* \* \* \*